(12) United States Patent
Benner et al.

(10) Patent No.: US 10,920,938 B2
(45) Date of Patent: *Feb. 16, 2021

(54) LED APPARATUS EMPLOYING NEODYMIUM BASED MATERIALS WITH VARIABLE CONTENT OF FLUORINE AND OXYGEN

(71) Applicant: Consumer Lighting (U.S.), LLC, Norwalk, CT (US)

(72) Inventors: Kevin Jeffrey Benner, East Cleveland, OH (US); Thomas J. Boyle, East Cleveland, OH (US); Dengke Cai, Mentor, OH (US); Thomas Clynne, East Cleveland, OH (US); William Erwin Cohen, East Cleveland, OH (US); Jean-Patrick Ducroux, East Cleveland, OH (US); Jianmin He, East Cleveland, OH (US); Jon Bennett Jansma, East Cleveland, OH (US); Chuan Lin, Shanghai (CN); Juliana P. Reisman, East Cleveland, OH (US); Alok Mani Srivastava, Niskayuna, NY (US); Benjamin James Ward, Beachwood, OH (US); Zhiyong Wang, Shanghai (CN); William Robert Wright, East Cleveland, OH (US); Qing Yi, Shanghai (CN)

(73) Assignee: Savant Technologies LLC, East Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/848,756

(22) Filed: Apr. 14, 2020

(65) Prior Publication Data

US 2020/0326042 A1 Oct. 15, 2020

Related U.S. Application Data

(63) Continuation of application No. 16/078,383, filed as application No. PCT/CN2016/076459 on Mar. 16, 2016, now Pat. No. 10,619,803.

(51) Int. Cl.
*F21K 9/66* (2016.01)
*F21V 3/10* (2018.01)
(Continued)

(52) U.S. Cl.
CPC ............... *F21K 9/66* (2016.08); *F21K 9/232* (2016.08); *F21S 8/04* (2013.01); *F21V 3/10* (2018.02);
(Continued)

(58) Field of Classification Search
CPC ..... F21V 3/10; F21V 9/00; F21K 9/66; F21K 9/232; F21S 8/04; H01L 27/322
(Continued)

(56) References Cited

U.S. PATENT DOCUMENTS 8,646,926 B2 2/2014 Manabe
9,062,851 B2 6/2015 Matsubayashi
(Continued)

FOREIGN PATENT DOCUMENTS

CN 102667978 A 9/2012
CN 105720163 A 6/2016
(Continued)

OTHER PUBLICATIONS

International Search Report issued in connection with corresponding PCT application No. PCT/CN2016/076459 dated Nov. 23, 2016.
(Continued)

*Primary Examiner* — Rajarshi Chakraborty
*Assistant Examiner* — Michael Chiang
(74) *Attorney, Agent, or Firm* — Wood IP LLC

(57) ABSTRACT

The specification and drawings present a new apparatus such as a lighting apparatus, the apparatus comprising at least one LED (or OLED) module, configured to generate a visible light such as white light, and at least one component such as optical component comprising a compound consisting
(Continued)

essentially of the elements neodymium (Nd) and fluorine (F), and optionally including one or more other elements. The lighting apparatus is configured to provide a desired light spectrum by filtering the generated visible light using the compound. The at least one component can comprise a $NdF_xO_y$ compound with values of x and y determining a content ratio F/O, which may be adjusted during manufacturing of the $NdF_xO_y$ compound to provide desired output light parameters of the apparatus including at least a desired output light spectrum realized by filtering the generated visible light using the $NdF_xO_y$ compound.

17 Claims, 12 Drawing Sheets

(51) Int. Cl.

| | | |
|---|---|---|
| *F21S 8/04* | (2006.01) | |
| *H01L 27/32* | (2006.01) | |
| *F21V 9/20* | (2018.01) | |
| *F21K 9/232* | (2016.01) | |
| *F21Y 115/15* | (2016.01) | |
| *F21Y 115/10* | (2016.01) | |

(52) U.S. Cl.
CPC .............. *F21V 9/20* (2018.02); *H01L 27/322* (2013.01); *F21Y 2115/10* (2016.08); *F21Y 2115/15* (2016.08)

(58) Field of Classification Search
USPC ........................................................ 313/489
See application file for complete search history.

(56) References Cited

U.S. PATENT DOCUMENTS

| 9,242,296 | B2 | 1/2016 | Kaneko et al. |
|---|---|---|---|
| 9,312,249 | B2 | 4/2016 | Choi et al. |
| 9,335,531 | B2 | 5/2016 | Athalye |
| 9,593,812 | B2 | 3/2017 | van de Ven |
| 9,759,387 | B2 | 9/2017 | Progl |
| 10,619,803 | B2 | 4/2020 | Benner |
| 2004/0196538 | A1 | 10/2004 | Burgener et al. |
| 2006/0176244 | A1 | 8/2006 | Hori et al. |
| 2006/0255716 | A1 | 11/2006 | Tsutsumi et al. |
| 2007/0241657 | A1 | 10/2007 | Radkov et al. |
| 2009/0302236 | A1 | 12/2009 | Vogt et al. |
| 2010/0277887 | A1 | 11/2010 | Su et al. |
| 2011/0155972 | A1 | 6/2011 | Wu et al. |
| 2011/0279998 | A1 | 11/2011 | Su et al. |
| 2012/0114515 | A1 | 5/2012 | Kaneko et al. |
| 2012/0155061 | A1* | 6/2012 | Manabe ................. F21K 9/232 362/84 |
| 2012/0277887 | A1 | 11/2012 | Reese et al. |
| 2012/0300432 | A1* | 11/2012 | Matsubayashi .... C09K 11/7774 362/84 |
| 2013/0170199 | A1* | 7/2013 | Athalye ................. F21K 9/232 362/230 |
| 2013/0328100 | A1 | 12/2013 | Kono et al. |
| 2014/0049965 | A1 | 2/2014 | Aanegola et al. |
| 2014/0268794 | A1* | 9/2014 | Donofrio ................. G02B 1/04 362/293 |
| 2015/0308633 | A1* | 10/2015 | van de Ven ............ H05B 45/00 362/84 |
| 2015/0377429 | A1 | 12/2015 | Yoo et al. |
| 2016/0238230 | A1 | 8/2016 | Trottier |
| 2016/0303394 | A1 | 10/2016 | Hayashi et al. |

FOREIGN PATENT DOCUMENTS

| WO | 2009083867 | | 7/2009 | |
|---|---|---|---|---|
| WO | WO-2009083867 | A1 * | 7/2009 | ............ G02B 5/226 |
| WO | 20130180216 | A1 | 1/2016 | |

OTHER PUBLICATIONS

Chinese office action issued in connection with related case China application No. 201580054742.5 dated Apr. 4, 2018.
International Search Report issued in connection with related case PCT application No. PCT/US15/054373 dated Dec. 14, 2015.
Evanthia Stefanidiki et. al., "Oxide Solubility and Raman spectea of NdF3-Lif-KF-MF2-Nd2O3 melts", The Royal Society of Chemistry 2002.
Chinese Office Action Received for Chinese Patent Application 201680083708.5 dated Apr. 30, 2019, 26 pages (10 pages Official Copy+16 Pages English Translation).

* cited by examiner

LED APPARATUS EMPLOYING NEODYMIUM BASED MATERIALS WITH VARIABLE CONTENT OF FLUORINE AND OXYGEN

CROSS-REFERENCE TO RELATED APPLICATIONS

This application is a continuation of U.S. patent application Ser. No. 16/078,383, filed Aug. 21, 2018, now U.S. Pat. No. 10,619,803, which is a National Stage Entry of PCT/CN2016/076459, filed Mar. 16, 2016, all of which are incorporated herein by reference in their entirety.

TECHNICAL FIELD

The invention generally relates to lighting applications and related technologies and more particularly but not exclusively, this invention relates to using compounds comprising neodymium and fluorine such as $NdF_xO_y$ with variable x and y for imparting a desired color filtering effect and other parameters in a light emitting diode (LED) light apparatus.

BACKGROUND OF THE INVENTION

Light emitting diodes (LEDs), which, as used herein also encompasses organic LEDs (OLEDs), are solid-state semiconductor devices that convert electrical energy into electromagnetic radiation that includes visible light (wavelengths of about 400 to 750 nm). An LED typically comprises a chip (die) of a semiconducting material, doped with impurities to create a p-n junction. The LED chip is electrically connected to an anode and a cathode, all of which are often mounted within an LED package. In comparison to other lamps such as incandescent or fluorescent lamps, LEDs emit visible light is more directional in a narrower beam.

An OLED typically comprises at least one emissive electroluminescent layer (a film of organic semiconductor) situated between electrodes (at least one electrode being transparent). The electroluminescent layer emits light in response to an electric current flowing between electrodes.

LED/OLED light sources (lamps) provide a variety of advantages over traditional incandescent and fluorescent lamps, including but not limited to a longer life expectancy, higher energy efficiency, and full brightness without requiring time to warm up.

Despite the appeal of LED/OLED lighting in terms of efficiency, longevity, flexibility, and other favorable aspects, there remains a need for continuous improvement in the color properties of LED lighting, especially in white LED/OLED devices, for use in both general illumination and in display applications.

FIG. 1 is a perspective view of a conventional LED-based lighting apparatus 10 suitable for area lighting applications. The lighting apparatus (which may also be referred to as a "lighting unit" or "lamp") 10 includes a transparent or translucent cover or enclosure 12, a threaded base connector 14, and a housing or base 16 between the enclosure 12 and the connector 14.

An LED-based light source (not shown) which can be an LED array including multiple LED devices, is located at the lower end of the enclosure 12 and adjacent the base 16. Because LED devices emit visible light in narrow bands of wavelengths, for example, green, blue, red, etc., combinations of different LED devices are often employed in LED lamps to produce various light colors, including white light. Alternatively, light that appears substantially white may be generated by a combination of light from a blue LED and a phosphor (e.g., yttrium aluminum garnet:cerium, abbreviated as YAG:Ce) that converts at least some of the blue light of the blue LED to a different color; the combination of the converted light and the blue light can generate light that appears white or substantially white. The LED devices can be mounted on a carrier within the base 16, and can be encapsulated on the carrier with a protective cover comprising an index-matching material to enhance the efficiency of visible light extraction from the LED devices.

To promote the capability of the lighting apparatus 10 to emit visible light in a nearly omnidirectional manner, the enclosure 12 shown in FIG. 1 may be substantially spheroidal or ellipsoidal in shape. To further promote a nearly omnidirectional lighting capability, the enclosure 12 may include a material that enables the enclosure 12 to function as an optical diffuser. Materials employed to produce the diffuser may include polyamides (e.g., nylon), polycarbonate (PC), polypropylene (PP), or the like. These polymeric materials can also include $SiO_2$ to promote refraction of the light and thereby to achieve a white reflective appearance. The inner surface of the enclosure 12 may be provided with a coating (not shown) that contains a phosphor composition.

Though the use of combinations of different LED devices and/or phosphors can be utilized to promote the ability of LED lamps to produce a white light effect, other approaches are desirable as alternatives, or in addition thereto, to improve chromatic characteristics of the white light generated by the LED devices.

SUMMARY OF THE INVENTION

According to some embodiments of the invention, an apparatus is provided comprising: at least one light emitting diode (LED) module, configured to generate a visible light; and at least one component comprising a compound of $NdF_xO_y$ having corresponding concentrations of neodymium (Nd), fluorine (F) and oxygen (O), where values of x and y determine a ratio of the F and O and are adjusted during manufacturing of the $NdF_xO_y$ compound to provide desired output light parameters of the apparatus including at least a desired output light spectrum realized by filtering the generated visible light using the $NdF_xO_y$ compound. Further, the $NdF_xO_y$ compound may be a single crystalline phase compound.

According some embodiments of the invention, the $NdF_xO_y$ compound may be manufactured by wet chemical processing from neodymium oxide ($Nd_2O_3$) using fluoridation processing with a flowing gas of fluorine ($F_2$) or with hydrofluoric acid (HF). Further, parameters x and y in the $NdF_xO_y$ may be controlled during the fluoridation processing using varying one or more parameters including: hydrofluoric acid (HF) concentration, processing temperature, reaction time, and fluorine gas ($F_2$) concentration.

According some embodiments of the invention, the $NdF_xO_y$ compound may be manufactured by dry processing using a solid reaction method comprising blending neodymium oxide ($Nd_2O_3$) with neodymium fluoride ($NdF_3$) at a predefined weight ratio of the $Nd_2O_3$ and $NdF_3$, to form a blended compound, followed by high temperature synthesis of the $NdF_xO_y$ compound from the blended compound under a protective atmosphere of an inert gas, wherein the predefined weight ratio of the $Nd_2O_3$ and $NdF_3$ corresponds to the ratio of F and O in the manufactured $NdF_xO_y$ compound. Further, the inert gas may comprise nitrogen ($N_2$) gas or argon (Ar) gas. Still further, a temperature of the high temperature synthesis may be greater than 800° C.

Still further according some embodiments of the invention, providing the desired output light parameters may further include enhancement of one or more of: color correlated temperature (CCT), color saturation index (CSI), color rendering index (CRI), color rendering value R9, and revealness of the generated visible light.

BRIEF DESCRIPTION OF THE DRAWINGS

These and other features and aspects of the present disclosure will become better understood when the following detailed description is read with reference to the accompanying drawings, in which like characters represent like parts throughout the drawings, wherein.

DETAILED DESCRIPTION

Figure 1:
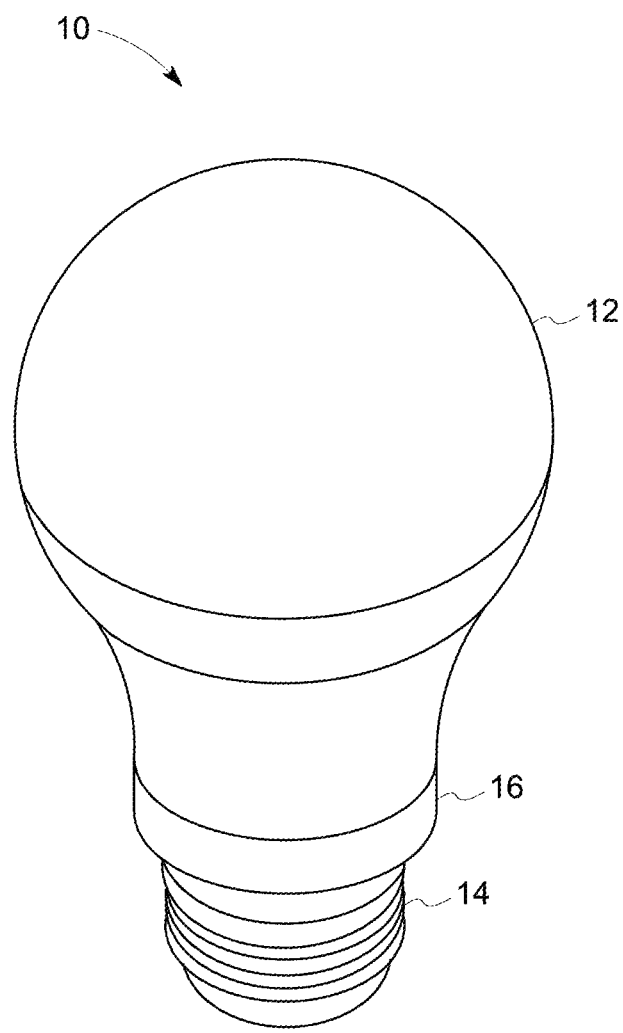
FIG. 1 is a perspective view of a conventional LED-based lighting apparatus.

A new apparatus such as a lighting apparatus is presented herein, the apparatus comprising at least one LED (or OLED) module configured to generate a visible light such as white light, and at least one component such as an optical component comprising a compound comprising elements of neodymium (Nd) and fluorine (F), and optionally comprising one or more other elements. The lighting apparatus can be configured to provide a desired light spectrum by filtering the generated visible light using the compound, as described herein. Typically the compound comprises $Nd^{3+}$ ions and $F^-$ ions. For the purpose of this invention, a "Nd—F compound" should be broadly construed to include compounds comprising neodymium and fluoride and optionally other elements.

According to one embodiment, the at least one component can comprise a compound of $NdF_xO_y$ having corresponding concentrations of neodymium (Nd), fluorine (F) and oxygen (O), where values of x and y determine a content ratio F/O and may be adjusted during manufacturing of the $NdF_xO_y$ compound (see FIGS. 6 and 7) to provide desired output light parameters of the lighting apparatus including at least a desired output light spectrum realized by filtering the generated visible light using the $NdF_xO_y$ compound.

Moreover, the $NdF_xO_y$ compound can comprise a desired absorption peak in a wavelength range between about 560 nm and 600 nm to provide the desired output light spectrum (as demonstrated in FIGS. 9, 10A and 10B), and may have a desired refractive index (RI) at the desired absorption peak from about 1.6 to about 1.8. Furthermore, based on the desired absorption spectrum and RI for various lighting applications, optimized values of x may be between 0.3 and 0.5, and optimized values of y may be between 1.25 and 1.33.

According to a further embodiment, the component may include a composite/encapsulating layer on a surface of the LED (OLED) chip so that a Nd—F compound such as $NdF_3$, and/or others disclosed herein, can be blended (dispersed) in that encapsulating layer, e.g., along with a phosphor, to achieve favorable visible absorption profiles. The composite/encapsulating layer may be formed using a low temperature glass, a polymer, a polymer precursor, a silicone or silicone epoxy resin or precursor, and the like.

According to another embodiment, the optical component may be a transparent, translucent, reflective or transflective (partially reflective and transmitting) substrate, and a coating on a surface of the substrate can apply a color filtering effect to the visible light, generated by the LED module, while it is passing through the optical component, e.g., to filter the visible light in the yellow light wavelength range, for example, for wavelengths from about 560 nm to about 600 nm.

Furthermore, the transparent or translucent substrate of the optical component may be a diffuser, such as a bulb, a lens and an envelope enclosing at least one LED chip. Moreover, the substrate may be a reflective substrate, and the LED chip can be arranged outside of the substrate. The Nd—F and/or Nd—X—F compound coating may be disposed on a surface of the substrate, and the thickness of the coating should be sufficient to achieve the color filtering effect. The thickness may typically be within a range from 50 nm to 1000 microns, with a preferred thickness being between 100 nm to 500 microns.

The resultant devices can exhibit improvement of light parameters using filtering with Nd—F compounds/materials having intrinsic absorption in the visible region between about 530 nm and 600 nm to enhance CSI (color saturation index), CRI (color rendering index), R9 (color rendering value) revealness (lighting preference index, LPI) and the like. R9 is defined as one of 6 saturated test colors not used in calculating CRI. The "revealness" is a parameter of the emitted light based on a version of the LPI, which is described in co-pending, commonly owned International application PCT/US2014/054868, filed Sep. 9, 2014 (published as WO2015/035425 on Mar. 12, 2015), and hereby incorporated by reference in pertinent part.

In one embodiment, it is advantageous to utilize relatively low refractive index (RI) Nd—F materials (such as $NdF_3$ having RI around 1.6) to match the RI of the encapsulation materials, in order to achieve a lower scattering loss in LED packages and chip-on-board (COB) arrays. Moreover, it is further advantageous to be able to tune the absorption spectrum by including an electronegative "X" atom in a Nd—X—F material, where X can be, for example, O, N, S, Cl, or the like, to broaden the absorption at around 580 nm and thus possibly to enhance color rendering of an R9 color chip. Any of the foregoing may be blended into an encapsulating material for color adjustment purposes. Upon selection of an appropriate Nd—F or Nd—X—F material (to be more fully defined below), the scattering losses due to RI mismatch can be minimized. The use of Nd—F compounds may also be advantageous for use in LED lighting applications containing short UV wavelengths, since Nd—F compounds are generally not activated in a wavelength range about 380-450 nm.

According to another embodiment, the Nd—F compound may comprise neodymium fluoride ($NdF_3$), or neodymium oxyfluoride (e.g., $NdO_xF_y$, where $2x+y=3$, such as $Nd_4O_3F_6$), or neodymium fluoride comprising adventitious water and/or oxygen, or a neodymium hydroxide fluoride (e.g., $Nd(OH)_aF_b$, where $a+b=3$), or numerous other compounds comprising neodymium and fluoride which will become readily apparent from the following description. In some applications, the Nd—F compound may have a relatively low refractive index, such as a refractive index that matches selected polymeric materials to provide a low-loss blend. One such Nd—F material is believed to be neodymium fluoride ($NdF_3$), which has a refractive index of around 1.6, providing a suitably low refractive index for index matching with certain polymeric matrix materials to minimize scattering losses.

According to a further embodiment, other Nd—F compounds/materials can be used to advantage as described herein. For instance, other compounds containing Nd—F, non-limiting examples of which may include Nd—X—F compounds. In addition to the previous statement that X can be O, N, S, Cl, or the like, X can also be at least one metallic element (other than Nd) that can form a compound with fluorine. Examples are: a metallic element such as Na, K, Al, Mg, Li, Ca, Sr, Ba, or Y, or combinations of such elements. For example, a Nd—X—F compound may comprise $NaNdF_4$. Further examples of Nd—X—F compounds may include compounds in which X may be Mg and Ca or may be Mg, Ca and O; as well as other compounds containing Nd—F, including perovskite structures doped with neodymium. Certain Nd—X—F compounds may advantageously enable broader absorption at wavelengths of about 580 nm. Since a neodymium oxyfluoride compound may comprise varying amounts of O and F (since neodymium oxyfluoride compounds are typically derived from varying amounts of neodymium oxide (neodymia) $Nd_2O_3$ and neodymium fluoride $NdF_3$), a neodymium oxyfluoride compound may have a selected refractive index that is between that of a Nd—O compound (for example, 1.8 for neodymia) and a Nd—F compound (for example, 1.60 for $NdF_3$). Non-limiting examples of perovskite structure materials doped with neodymium can include those containing at least one constituent having a lower refractive index than the neodymium compound (e.g., $NdF_3$), for example, metal fluorides of Na, K, Al, Mg, Li, Ca, Sr, Ba, and Y. Such "host" compounds may have lower refractive indices than $NdF_3$ in the visible light spectrum, non-limiting examples of which may include NaF (n=1.32), KF (n=1.36), $AlF_3$ (n=1.36), $MgF_2$ (n=1.38), LiF (n=1.39), $CaF_2$ (n=1.44), $SrF_2$ (n=1.44), $BaF_2$ (n=1.48), and $YF_3$ (n=1.50) at a wavelength of 589 nm. As a result of doping with a high refractive index Nd—F compound, for example, $NdF_3$, the resulting doped perovskite structure compound can have a refractive index that is between that of the host (for example, 1.38 for $MgF_2$) and that of $NdF_3$ (1.60). The refractive index of the $NdF_3$-doped metal fluoride compound will depend on the ratio of Nd and metal ions.

The refractive index of $NdF_3$ is about 1.60. Therefore, it may sometimes be considered as providing a relative good RI match blend with silicone (which may have a refractive index around 1.51). An even better match may be obtained by mixing $NdF_3$ with another material that may or may not comprise Nd. For example, $NaNdF_4$ has an RI around 1.46. Thus, by proper blending of $NdF_3$ with another material such as NaF or $NaNdF_4$, the refractive index of the blend can be made to match that of silicone even better.

Figure 2:
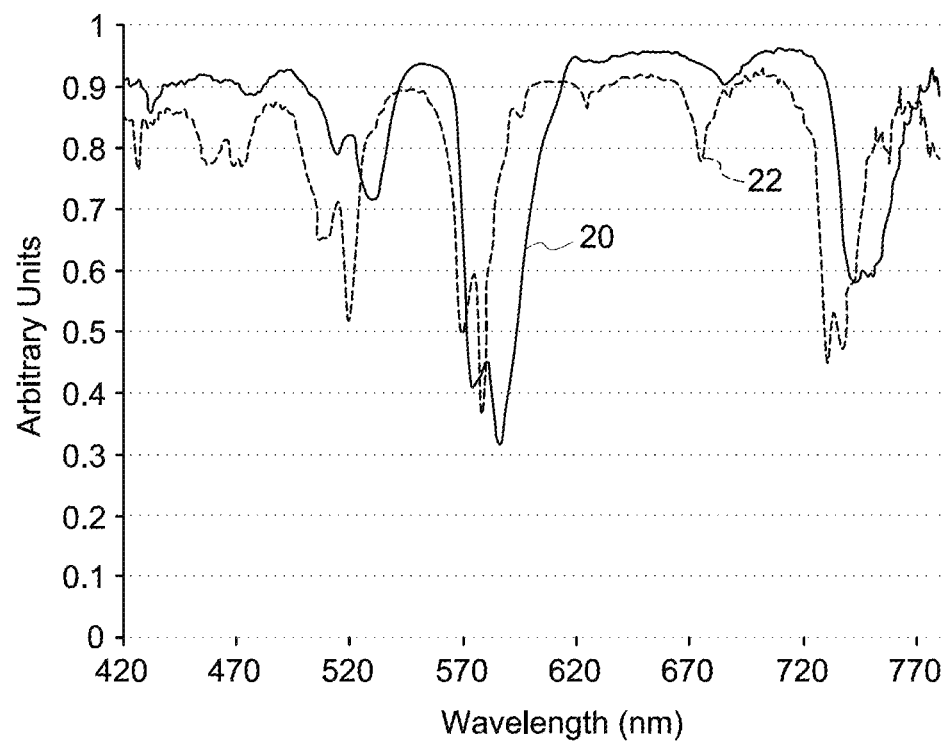
FIG. 2 is a graph comparing absorption in a visible spectrum (measured by a reflective technique) of neodymium fluoride dispersed in silicone vs. that of standard neodymium glass.

FIG. 2 is a graph comparing absorption in a visible spectrum (measured by a reflective technique) of neodymium fluoride dispersed in silicone represented by a curve 22, vs. that of standard neodymium glass (e.g., using $Na_2O$—$Nd_2O_3$—CaO—MgO—$Al2O_3$—$K_2O$—$B_2O_3$—$SiO_2$ as a composition for the Nd glass) represented by a curve 20 as a function of wavelength. It is significant that the respective materials share many of the same absorptive features, especially in the yellow (e.g., about 570 nm-about 590 nm) region. In use, one may encapsulate an LED chip/die with an encapsulant (e.g., silicone, epoxy, acrylic, or the like); the encapsulant may comprise a Nd—F or Nd—F—O based material such as $NdF_3$ in silicone deposited directly on the LED chip or on the array of LED chips (e.g., chip-on-board array, COB array) as further detailed herein.

Figure 3:
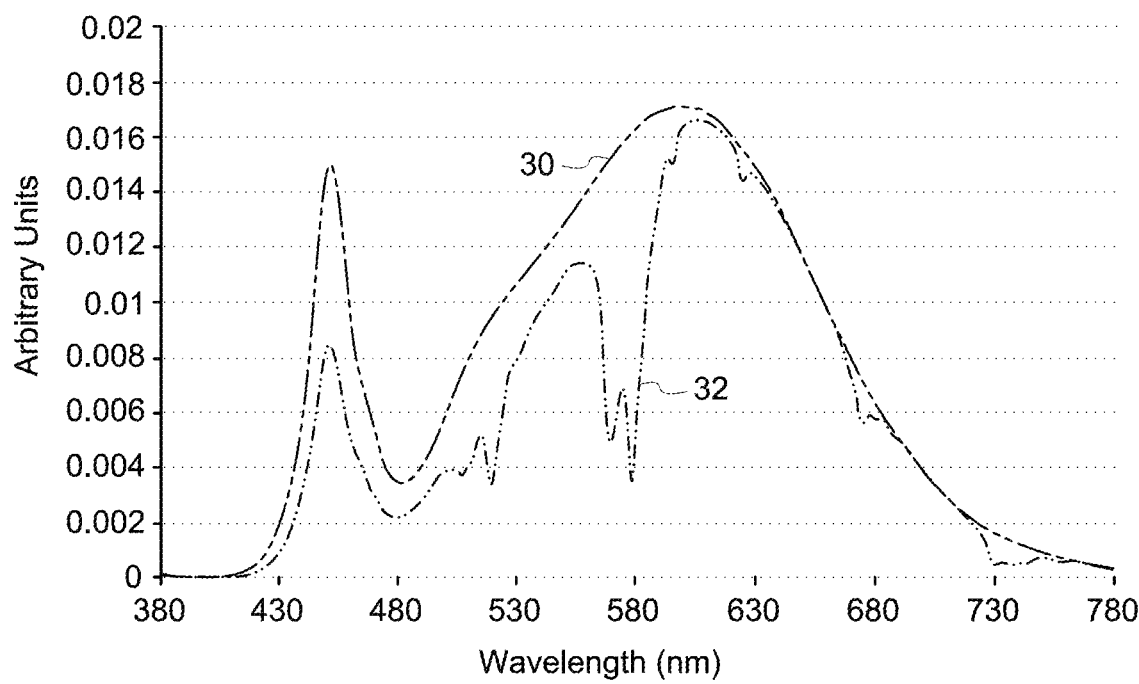
FIG. 3 is a graph comparing an emission spectrum of $NdF_3$ blended into silicone and directly deposited on a commercial LED package (NICHIA 757), and an emission spectrum of the base NITCHIA757 LED.

FIG. 3 is a graph comparing an emission spectrum of $NdF_3$ blended into silicone and directly deposited on a commercial LED package (NICHIA 757), i.e., encapsulating this LED package, as represented by a curve 32. As can be seen in FIG. 3, the spectrum is quite different, in that a significant depression is seen at a region or regions in the area between about 570 nm and about 590 nm, as compared to the emission spectrum of the base NITCHIA757 LED, represented by a curve 30.

Figure 4:
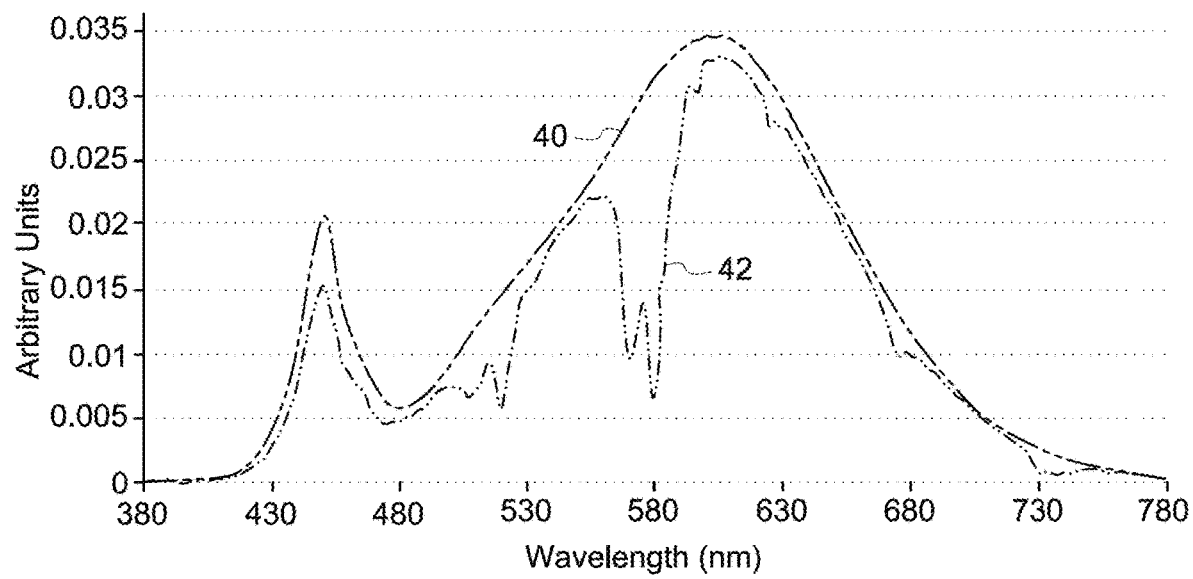
FIG. 4 is a graph comparing an emission spectrum of $NdF_3$ blended into silicone and directly deposited upon a COB array (TG66), and an emission spectrum of the base TG66 COB array.

FIG. 4 is a graph comparing an emission spectrum of $NdF_3$ blended into silicone and directly deposited on a COB array (TG66) represented by a curve 42, to that of the base TG66 COB array represented by a curve 40 as a function of wavelength. The spectrum presented by the curve 42 is similar to the curve 32 of FIG. 3.

The above examples evidence the utility of a Nd—F material (e.g., $NdF_3$) as a color-filtering absorptive material, applied as part of an encapsulating material to LED packages or arrays, to enhance at least one of the following lighting metrics: CSI, CRI, R9, whiteness index (i.e., proximity to the white body locus), or the like. Table 1 below shows resultant performances for examples presented in FIGS. 3 and 4 compared with a conventional LED comprising Nd glass.

TABLE 1

Comparison of resultant performances presented in FIGS. 3 and 4 with a conventional LED with Nd:glass.

|  | L/W | CCX | CCY | CCT | CRI | R9 | GAI | Revealness |
|---|---|---|---|---|---|---|---|---|
| NdF₃ on NICHIA 757 | 236 | 0.4498 | 0.3954 | 2722 | 92 | 50 | 49 | 110 |
| NdF₃ on TG 66 | 249 | 0.4503 | 0.3934 | 2698 | 90 | 39 | 48 | 110 |
| White LED with Nd glass | 249 | 0.4486 | 0.3961 | 2700 | 88 | 62 | 50 | 111 |

As can be seen above from Table 1, the NICHIA 757 LED device generally has a Lumens/Watt value of 236. When $NdF_3$ is used as encapsulant in silicone, the CRI (color rendering/saturation index) is 92, the R9 (color rendering value of a red color chip) has a value of 60, the gamut area index (GAI) is 49, and the revealness based on LPI (as defined herein) of the emitted light is 110. When the TG 66 array of LED chips (COB array) is encapsulated in silicone comprising $NdF_3$, the CRI is seen to be 90, the R9 value is 39, the GAI is 50, and "Revealness" is also 110. These values compare favorably to the color filtering effects of Nd glass combined with white LEDs, as shown on the bottom row of the Table 1. Values of chromaticity coordinates (CCX and CCY) and CCT (color correlated temperature) are shown for reference for all three cases.

The Nd—F material does not have to be simply neodymium fluoride ($NdF_3$) as in the example of FIGS. 3 and 4. It may also be any one of Nd—X—F compounds with X representing other element or a combination of elements as described above, and being chemically attached with F. In this manner, such Nd—X—F material may enhance at least one of the following lighting metrics: CSI, CRI, R9, whiteness index (i.e., proximity to the white body locus), or the like.

Figure 5:
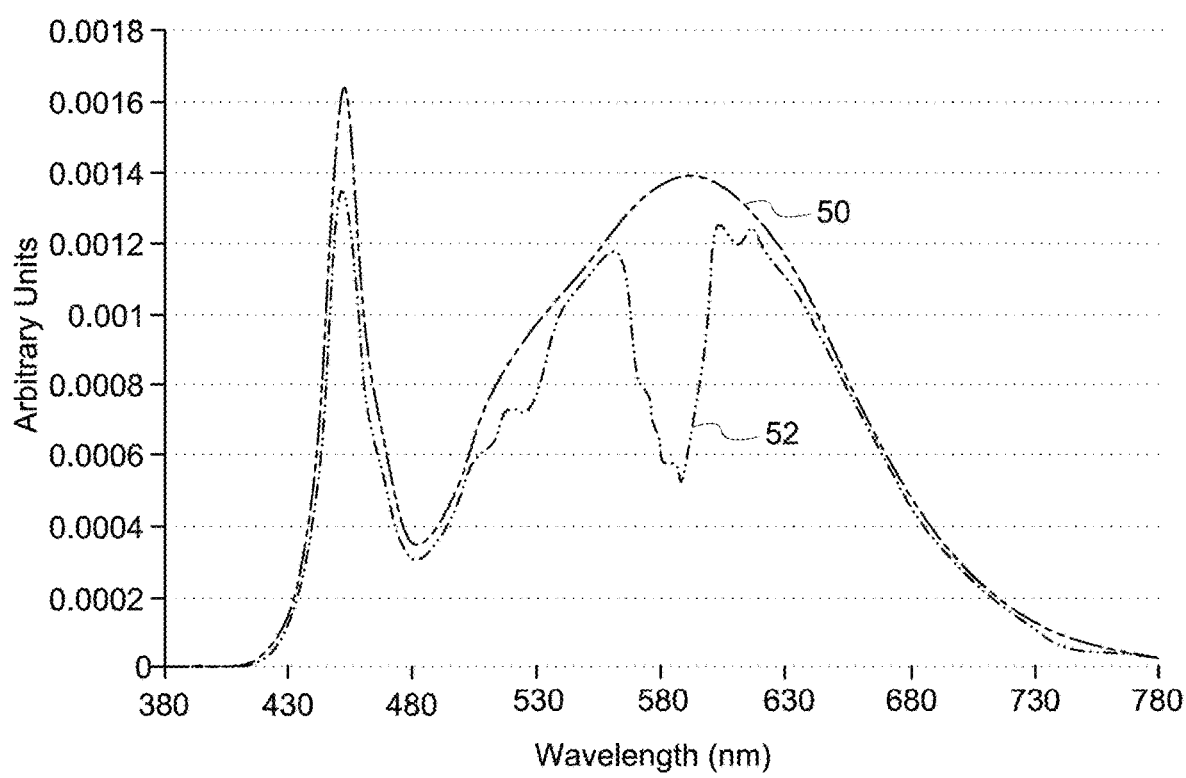
FIG. 5 is a graph comparing an emission spectrum of Nd—F—O blended into silicone and directly deposited on a commercial LED package (NICHIA 757 with 4000K CCT), and an emission spectrum of the base NITCHIA757 LED.

For example, FIG. 5 is a graph comparing an emission spectrum of Nd—F—O blended into silicone and directly deposited on a commercial LED package (NICHIA 757 with 4000K CCT), thus encapsulating this LED package, represented by a curve 52 as a function of wavelength. Similarly to the example of FIGS. 3 and 4, the spectrum 52 has a significant depression at a region or regions in the area between about 570 nm and about 590 nm, as compared to the emission spectrum of the base NITCHIA757 LED represented by a curve 50.

Table 2 below shows resultant performances for the example presented in FIG. 5 for Nd—F—O in silicone directly deposited on a commercial LED package (NICHIA 757 with 4000K CCT) compared with a conventional LED with silicone encapsulant (NICHIA 757 with 4000K CCT) as well as with other types of silicone encapsulant doped with neodymia ($Nd_2O_3$) and with neodymium fluoride ($NdF_3$). Table 2 lists similar parameter as Table 1 with an addition of CSI (color saturation index) parameter for the above materials.

TABLE 2

The comparison of resultant performances for an LED with silicone encapsulant, doped with different Nd based materials, and without doping.

|  | Refractive index of encapsulant/ dopant | Lumens output | CCX | CCY | CCT | CRI | $R_9$ | CSI | Revealness (LPI) |
|---|---|---|---|---|---|---|---|---|---|
| Original LED (Nichia 757) | 1.40 (RI for silicone encapsulant per se) | 1427 | 0.457 | 0.4073 | 2715 | 81 | 15 | −14 | 91 |
| LED with NdFO doped silicone | 1.72 (for NdFO in silicone encapsulant) | 1316 | 0.454 | 0.4096 | 2776 | 88 | 44 | −3 | 98 |
| LED with $Nd_2O_3$ doped silicone | 1.8 (for neodymia $Nd_2O_3$ in silicone encapsulant) | 1162 | 0.4551 | 0.4153 | 2804 | 86 | 57 | −4 | 94 |
| LED with $NdF_3$ doped silicone | 1.6 (for $NdF_3$ in silicone encapsulant) | 1420 | 0.4454 | 0.4053 | 2872 | 84 | 23 | −11 | 94 |

It is noted that $Nd_2O_3$ will have a higher scattering loss than either NdFO or $NdF_3$. due to its higher RI. However, NdFO has a better performance on the balance between CSI and LPI. Compared with $Nd_2O_3$, the Nd—F compound such as $NdF_3$, either alone or mixed with the NdFO material, will have a lower RI to minimize scattering loss. Furthermore, as compared with $Nd_2O_3$, the Nd—F compound such as $NdF_3$, either alone or mixed with an NdFO material, can enable a desirable yellow absorption peak for the spectrum of the LED light, to achieve a higher CSI with a reduced lumen penalty. Values of chromaticity coordinates (CCX and CCY), CCT and CRI are shown for reference, for all four cases.

In certain embodiments, one may choose an Nd—F material or an Nd—F—O material or an Nd—X—F material, so as to have a refractive index match with the encapsulating material to minimize scattering loss. One may also blend one Nd—F material (e.g., neodymium fluoride) with another Nd—X—F material (e.g., neodymium oxyfluoride). The element "X" in an Nd—X—F compound may be chosen so as to tune the absorption in a region around 580 nm, in order to better match the spectrum with the "R9 curve".

In some embodiments, the Nd—F material (which broadly embraces all Nd—X—F materials described herein), may be blended into an encapsulating material along with one or more luminescent materials, such as phosphors. For example, the Nd—F color-filtering material may be blended with a yellow-green phosphor and/or a red phosphor. For example, the Nd—F material may be blended with a Ce-doped YAG phosphor and/or a conventional red nitride phosphor, such as a $Eu^{2+}$-doped CaAlSiN red phosphor. In another example, the Nd—F—O material can be blended with YAG:Ce phosphor and a red nitride phosphor in silicone, encapsulating a blue-emitting NICHIA 757 LED. Emission from the YAG:Ce phosphor and the red nitride phosphor may be enhanced by the addition of the Nd—F—O, due to Mie scattering theory.

According to further embodiments, the Nd—F—O compound may comprise variable content/composition of fluorine and oxygen, so that it can be presented generally as $NdF_xO_y$ compound with variable x and y which is equivalent to changing a ratio F/O for providing a desired color filtering effect, and for improving other output light parameters of the LED light apparatus. Several exemplary manufacturing methods of the $NdF_xO_y$ compound with variable x, y and their ratio x/y are described below.

Figure 6:
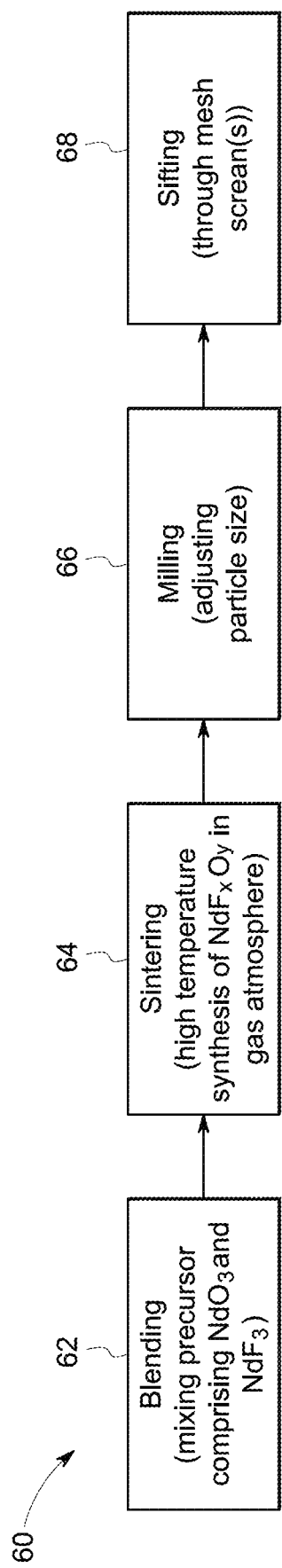
FIG. 6 is an exemplary flow chart for preparing $NdF_xO_y$ compound with a desired ratio F/O by a solid reaction process/method (dry process)

For example, the $NdF_xO_y$ compound can be prepared by an exemplary solid reaction process/method 60 (dry process) demonstrated in FIG. 6. According to this method, the $NdF_xO_y$ can be prepared by blending the $Nd_2O_3$ and $NdF_3$ powder materials at a predefined weight ratio in step 62, and then, in step 64, having the blended material being fired/sintered at high temperatures (greater than 800° C.) under a protective atmosphere of an inert gas such as nitrogen ($N_2$) gas, argon (Ar) gas, or the like, to form a desired solid NdFO, material. According to this method, a predefined weight ratio of the $Nd_2O_3$ and $NdF_3$ powder materials can determine the ratio F/O (or x/y) in the formed $NdF_xO_y$ material. For example, for the weight ratio of $Nd_2O_3$ and $NdF_3$ being 80% to 20%, the resulting Nd—F—O material can have a composition $NdF_{0.33}O_{1.33}$. Additional steps 66 and 68 can be used for further processing including milling (step 66) for providing/adjusting different particle sizes, and sifting through mesh screens (step 68) using, e.g., a vibration sifter for selecting particles with a preselected particle size.

Figure 7:
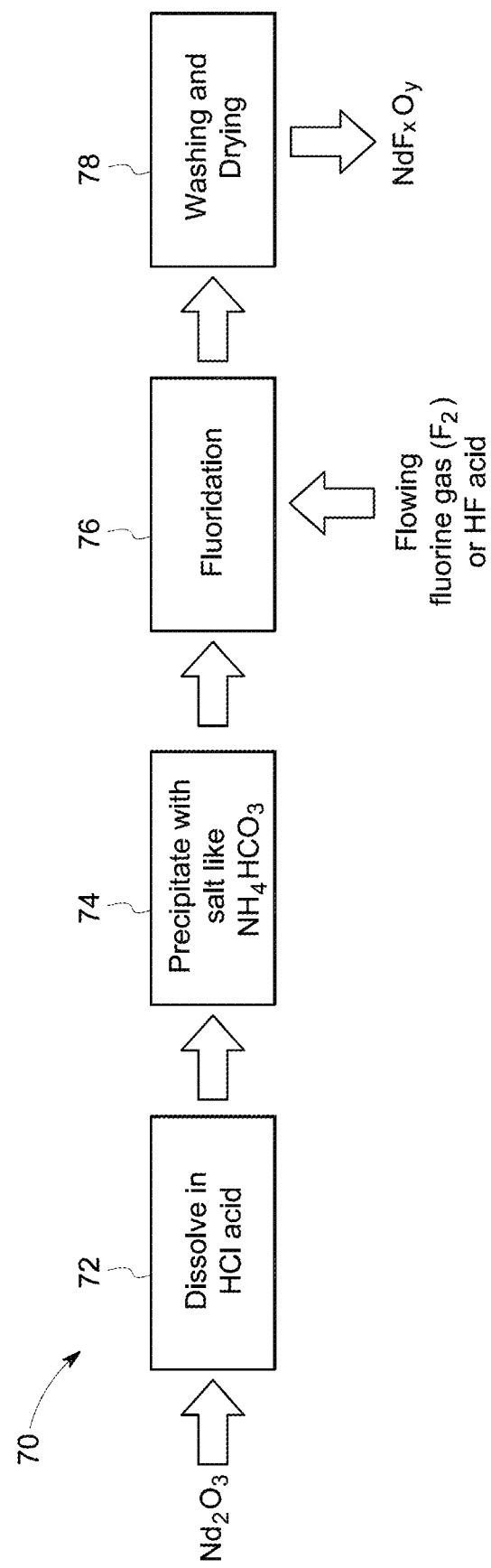
FIG. 7 is an exemplary flow chart for preparing $NdF_xO_y$ compound with a desired ratio F/O by a solid wet-chemical process/method from $Nd_2O_3$.

Alternatively, the $NdF_xO_y$ material with the desired concentration/ratio of F and O (or equivalently x and y) can be prepared using an exemplary wet-chemical process/method 70 from the starting $Nd_2O_3$ material, as illustrated in FIG. 7. In step 72, the $Nd_2O_3$ material (e.g., in a powder form) can be dissolved in a hydrohallic acid such as hydrochloric acid (HCl). Then, in step 74, the dissolved $Nd_2O_3$ can be further precipitated with a salt like $NH_4HCO_3$ to form a precipitated (solid) salt. Forming the desired $NdF_xO_y$ material can be performed in step 76, using fluoridation process by reaction of the precipitated salt with a flowing gas of fluorine ($F_2$) or with hydrofluoric acid (HF). The desired content of F and O and/or F/O ratio (equivalent to x, y and x/y ratio) in the formed $NdF_xO_y$ material can be provided by adjusting the flow rate of $F_2$ or by varying the HF acid concentration, and by adjusting temperature, reaction time and the like. The process 70 is normally concluded with washing and drying (step 78) of the formed $NdF_xO_y$ material.

It is noted that the process 70 in FIG. 7 can be modified, so that step 74 can be skipped and step 76 can be performed by precipitating the $Nd_2O_3$ dissolved in hydrohallic acid with the HF acid. It is noted that the exact sequence or order of steps shown in FIG. 6 or 7 is not required, so in principle, the various steps may be performed out of the illustrated order. Also certain steps may be skipped, different steps may be added or substituted, or selected steps or groups of steps may be performed in a separate application following the embodiments described herein.

Figure 8:
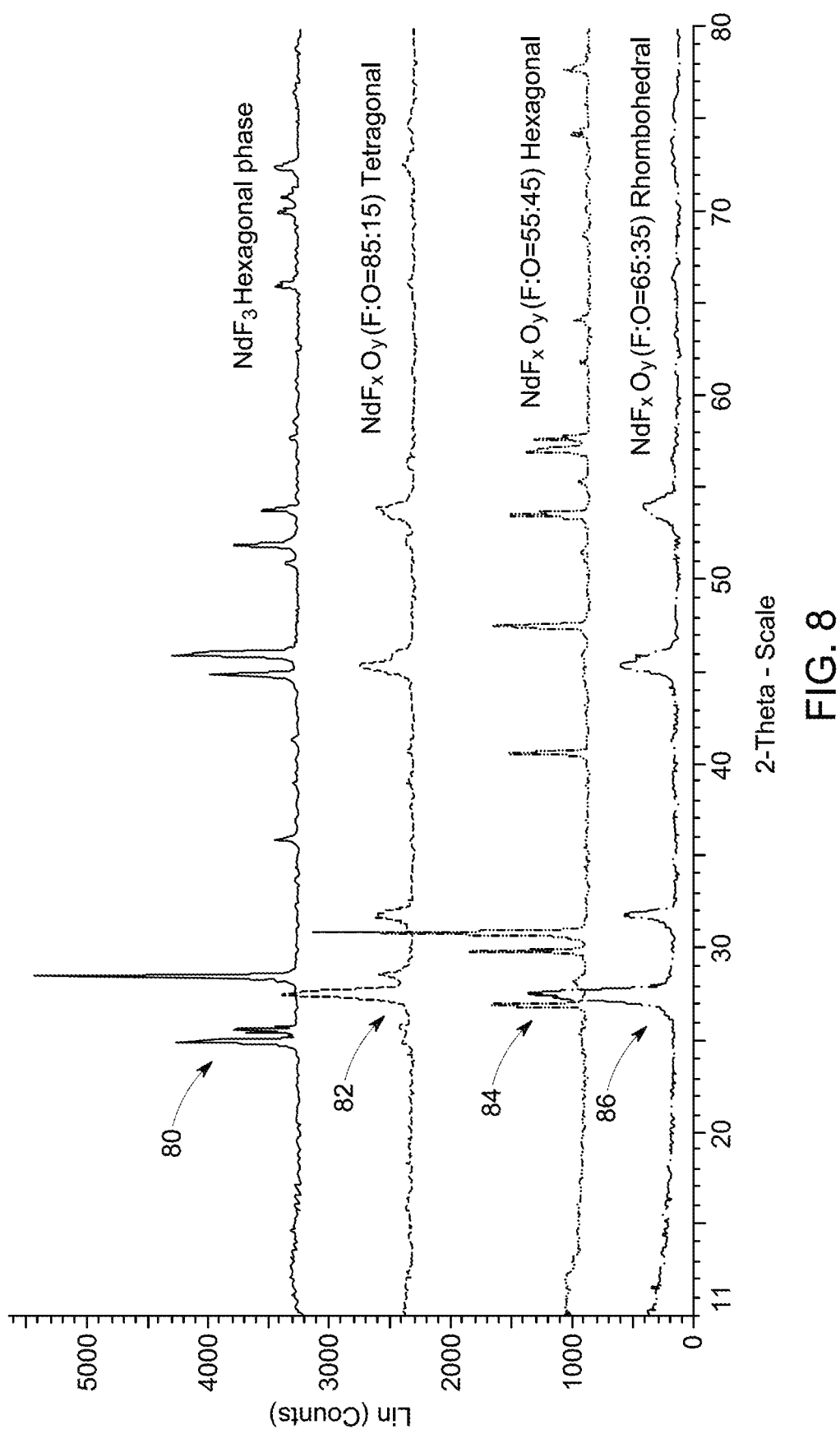
FIG. 8 is a graph depicting X-ray diffraction (XRD) results for $NdF_xO_y$ compounds with different F/O ratios and for $NdF_3$ compound, having different single crystalline phase structures.

The manufactured $NdF_xO_y$ compounds using methods demonstrated in FIGS. 6 and 7 can have a single crystalline phase, but a crystalline structure/system may be different for the $NdF_xO_y$ compounds with different F/O ratios as demonstrated in FIG. 8 showing X-ray diffraction (XRD) results for the $NdF_xO_y$ material having different F/O ratios. A curve 80 corresponds to $NdF_3$ (having no oxygen) with a hexagonal crystalline phase structure. A curve 82 corresponds to $NdF_xO_y$ having the F/O ratio of 85/15 with a tetragonal crystalline phase structure. A curve 84 corresponds to $NdF_xO_y$ having the F/O ratio of 55/45 having a hexagonal crystalline phase structure. A curve 86 corresponds to $NdF_xO_y$ having the F/O ratio of 65/35 with a rhombohedral crystalline phase structure.

Figure 9:
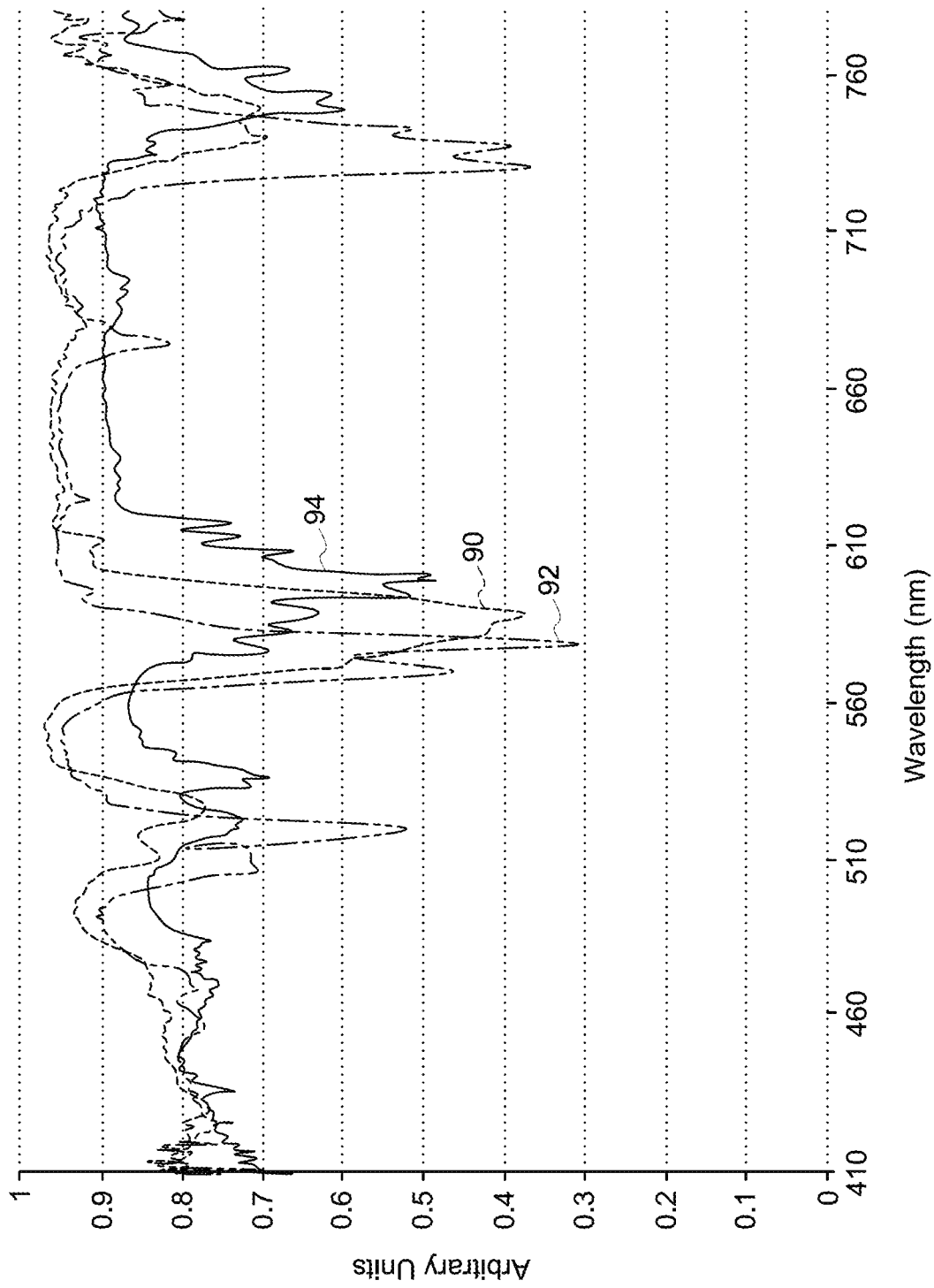
FIG. 9 is a graph comparing absorption in a visible spectrum (measured by a reflective technique) of $NdF_{0.33}O_{1.33}$ manufactured from 80% of $Nd_2O_3$ and 20% of $NdF_3$.

FIG. 9 is a graph comparing absorption in a visible spectrum (measured by a reflective technique) of neodymium oxyfluoride $NdF_{0.33}O_{1.33}$ (composed of 80% of neodymium oxide $Nd_2O_3$ and 20% of neodymium fluoride $NdF_3$) represented by a curve 90, vs. that of the neodymium oxide $Nd_2O_3$ represented by a curve 94 and of the neodymium fluoride $NdF_3$ represented by a curve 92, as a function of wavelength (all samples being powder samples). It is significant that the respective materials share many of the same absorptive features, especially around the yellow region (e.g., from about 560 nm to about 610 nm). The curve 90 (for the $NdF_{0.33}O_{1.33}$) has the absorption peak around 589 nm, whereas the absorption peak of the curve 92 (for the $NdF_3$) is red shifted toward a blue-green region which can cause a drop in the CCT and whiter appearance of the LED generated light filtered by a filter comprising the $NdF_3$ compound. Moreover, the absorption peak of the curve 94 (for the $Nd_2O_3$) is shifted toward about 610 nm which can cause a whiter appearance and R9 enhancement of the LED generated light filtered by a filter comprising the $Nd_2O_3$ compound.

Figure 10A:
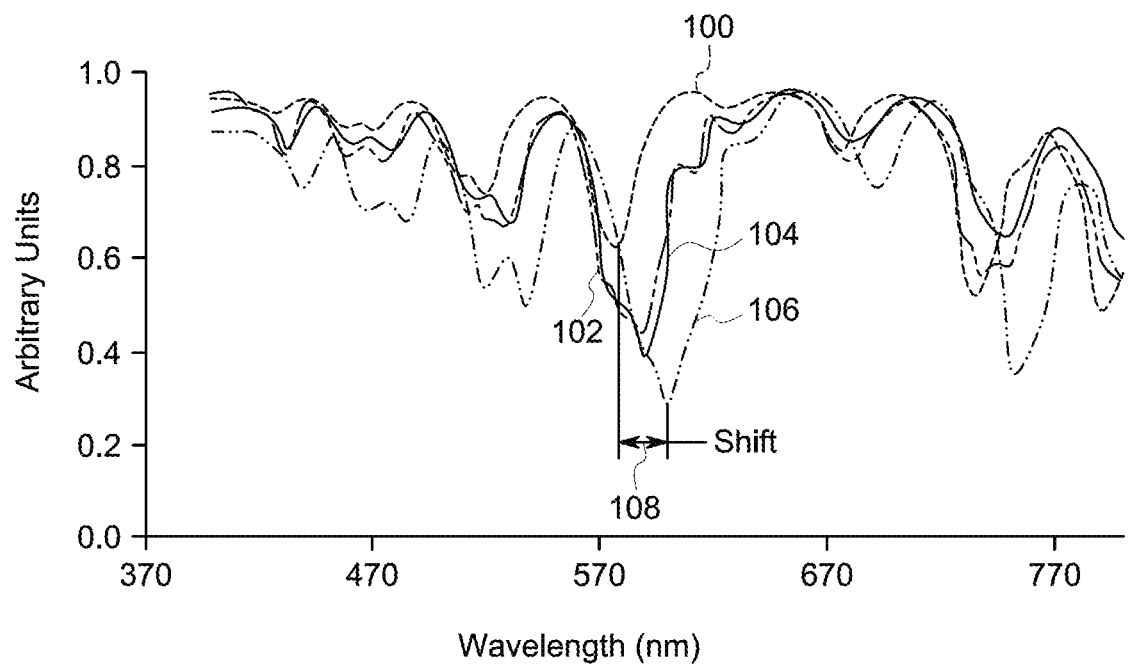
FIGS. 10A and 10B are exemplary graphs comparing absorption in a visible spectrum (measured by a reflective technique) of $NdF_xO_y$ having different ratios of F and O, and of $NdF_3$.
Figure 10B:
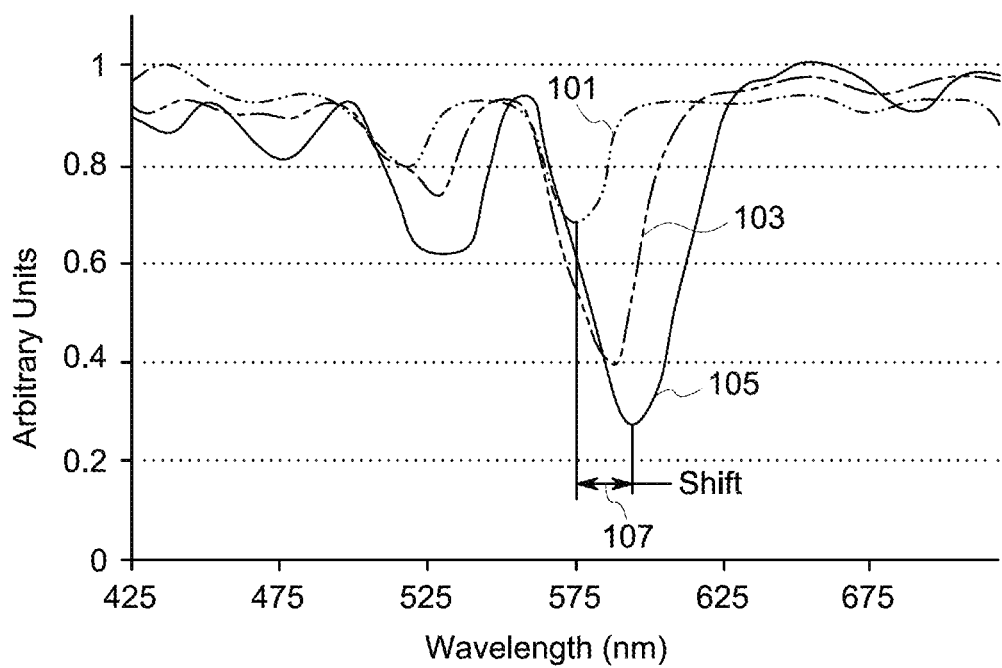

FIGS. 10A and 10B are exemplary graphs comparing absorption in a visible spectrum (measured by a reflective technique) of the $NdF_xO_y$ having different ratios of F and O, and of the neodymium fluoride $NdF_3$.

FIG. 10A shows results of absorption spectrum measurements (using a reflective technique) of powder materials of $NdF_xO_y$ with different F/O ratios, and of the $NdF_3$. A curves 100 is for the $NdF_3$ having the absorption peak at 579 nm. A curve 102 is for $NdF_xO_y$ having the F/O ratio 85/15 and the absorption peak at 583 nm). A curve 104 is for $NdF_xO_y$ having the F/O ratio 65/35 and the absorption peak at 587 nm. A curve 106 is for $NdF_xO_y$ having the F/O ratio 55/45 and the absorption peak at 601 nm. These results demonstrate a gradual red shift 106 of the absorption peak for the $NdF_xO_y$ with increasing content of oxygen from the absorption peak of the $NdF_3$.

FIG. 10B shows results of absorption spectrum measurements (using a reflective technique) of plastic materials doped with $NdF_xO_y$ having different F/O ratios, and of the $NdF_3$. A curves 101 is for the $NdF_3$ having the absorption peak at 579 nm. A curve 103 is for $NdF_xO_y$ having the F/O ratio 65/35 and the absorption peak at 589 nm), A curve 105 is for $NdF_xO_y$ having the F/O ratio 55/45 and the absorption peak at 600 nm. These results demonstrate a similar (to FIG. 10A) gradual red shift 107 of the absorption peak for the $NdF_xO_y$ with increasing content of oxygen from the absorption peak of the $NdF_3$.

Table 3 below shows a summary of performances for LEDs with filtering output light using plastic material (TEIJIN 2250 polycarbonate plastic material) doped with $NdF_xO_y$, (having F/O ratio 65/35), doped with $NdF_3$, and without doping using base LED (NICHIA NF2L757Dv1 middle power LED). The results demonstrate a significant enhancement/improvement of the LED performance with the output light being filtered by the $NdF_xO_y$ doped plastic material including increase of CCT from 3018° C. (base LED) to 3079° C., of CRI from 82 (base LED) to 94, and of R9 (color rendering value of a red color chip) from 16 to 89. The LED performance with the output light being filtered by the $NdF_3$ doped plastic material also show some marginal improvement (e.g., CRI being increased to 89.8 and of R9 being increased to 34), but less significant than for the $NdF_xO_y$ doped plastic material. Also, the CCT for the $NdF_3$ doped plastic material drops to 2845° C. from 3018° C. for the base LED

TABLE 3

The comparison of resultant performances of LEDs with filtering using plastic doped with $NdF_xO_y$, doped with $NdF_3$, and without doping (base LED).

| | CRI | R9 | CCX | CCY | CCT |
|---|---|---|---|---|---|
| Base LED | 82 | 16 | 0.4317 | 0.3955 | 3018 |
| 2 weight % $NdF_xO_y$ doped plastic | 94 | 89 | 0.4221 | 0.3823 | 3079 |
| 4.5 weight % $NdF_3$ doped plastic | 89.8 | 34 | 0.4387 | 0.3912 | 2845 |

FIGS. 11A-11D demonstrate different non-limiting examples of an LED-based lighting apparatus 110a, 110b, 110c and 110d respectfully, incorporating ND-F compound (or Nd—X—F compound as described herein, including $NdF_xO_y$) along with the phosphor to achieve favorable visible absorption/generation characteristics, according to various embodiments of the invention. In FIGS. 11A-11D the LED-based lighting apparatus 110A, 110B, 110C or 110D includes a dome 112 that can be an optically transparent or translucent substrate enclosing an LED chip 115 mounted on a printed circuit board (PCB) 116. Leads provide current to the LED chip 115, thus causing it to emit radiation. The LED chip may be any semiconductor light source, especially a blue or ultraviolet light source that is capable of producing white light when its emitted radiation is directed onto the phosphor. In particular, the semiconductor light source may be a blue/ultraviolet emitting LED based on a nitride compound semiconductor generalized as $In_iGa_jAl_kN$ (where $0 \leq i$; $0 \leq j$; $0 \leq k$ and $i+j+k=1$) having an emission wavelength greater than about 200 nm and less than about 550 nm. More particularly, the chip may be a near-UV or blue emitting LED having a peak emission wavelength from about 400 to about 500 nm. Even more particularly, the chip may be a blue emitting LED having a peak emission wavelength in a range about 440-460 nm. Such LED semiconductors are known in the art.

Figure 11A:
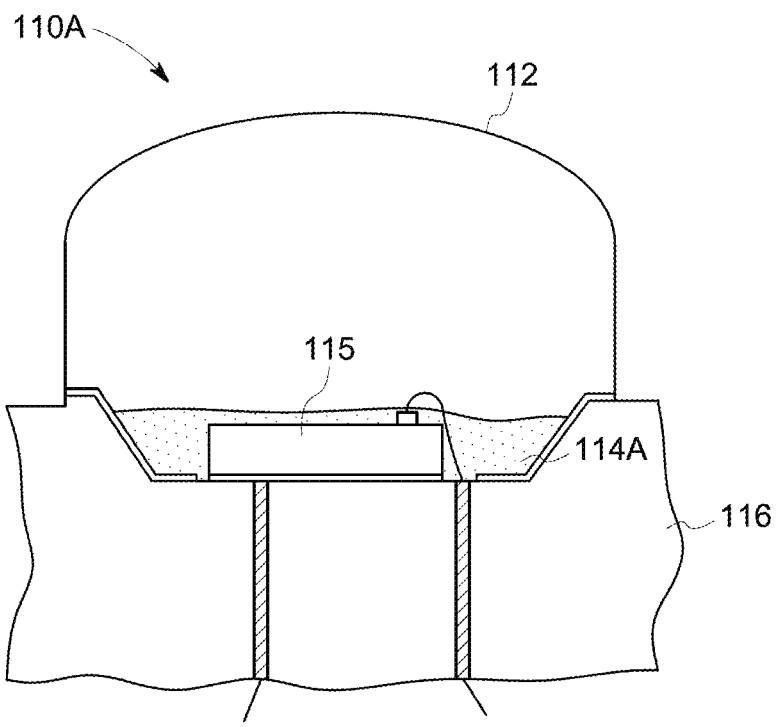
FIGS. 11A-11D are non-limiting examples of a LED-based lighting apparatus, incorporating a ND-F compound (or more generally Nd—X—F compound such as $NdF_xO_y$ compound, as described herein) along with a phosphor to impart favorable visible absorption/generation characteristics according to various embodiments of the invention.

According to one embodiment shown in FIG. 11A, a polymer composite layer (encapsulant compound) 114a can comprise a Nd—F, Nd—X—F and/or NdFO compound blended with a phosphor to impart favorable visible absorption/generation characteristics according to various embodiments described herein. This compound layer 114a can be disposed directly on a surface of the LED chip 115 and radiationally coupled to the chip. "Radiationally coupled" means that radiation from the LED chip is transmitted to the phosphor, and the phosphor emits radiation of a different wavelength. In a particular embodiment, the LED chip 115 may be a blue LED, and the polymer composite layer can include a blend of Nd—F and a yellow-green phosphor such as a cerium-doped yttrium aluminum garnet, Ce:YAG. The blue light emitted by the LED chip mixes with the yellow-green light emitted by the phosphors of polymer composite layer, and the net emission appears as white light which is filtered by the Nd—F. Thus LED chip 115 may be enclosed by the encapsulant material layer 114a. The encapsulant material may be a low-temperature glass, a thermoplastic or thermoset polymer or resin, or a silicone or epoxy resin. The LED chip 115 and the encapsulant material layer 64a may be encapsulated within a shell (restricted by the dome 112). Alternatively, the LED apparatus 110a may only include the encapsulant layer 114a without the outer shell/dome 112. In addition, scattering particles may be embedded in the encapsulant material. The scattering particles may be, for example, alumina ($Al_2O_3$), silica ($SiO_2$) or titania ($TiO_2$). The scattering particles can effectively scatter the directional light emitted from the LED chip, preferably with a negligible amount of absorption.

To form a polymer composite layer that includes the Nd—F, Nd—X—F and/or $NdF_xO_y$ on a surface of an LED chip, the particles may be dispersed in a polymer or polymer precursor, particularly a silicone or silicone epoxy resin, or precursors therefor. Such materials are well known for LED packaging. The dispersion mixture is coated on the chip by any suitable process, and particles having a larger density or particle size, or a larger density and larger particle size, preferentially settle in the region proximate the LED chip, forming a layer having a graded composition. Settling may occur during the coating or curing of the polymer or precursor, and may be facilitated by a centrifuging process, as known in the art. It is further noted that the parameters of dispersion of the phosphor and the Nd—F (e.g., Nd—X—F and/or $NdF_xO_y$), e.g., including particle density and size and process parameters, can be chosen to provide the phosphor material being closer to the LED chip 65 than Nd—F (e.g., Nd—X—F and/or $NdF_xO_y$) compounds, in order to provide an appropriate filtering by the Nd—F, Nd—X—F and/or $NdF_xO_y$ compound of the light generated by the phosphor component.

Figure 11B:
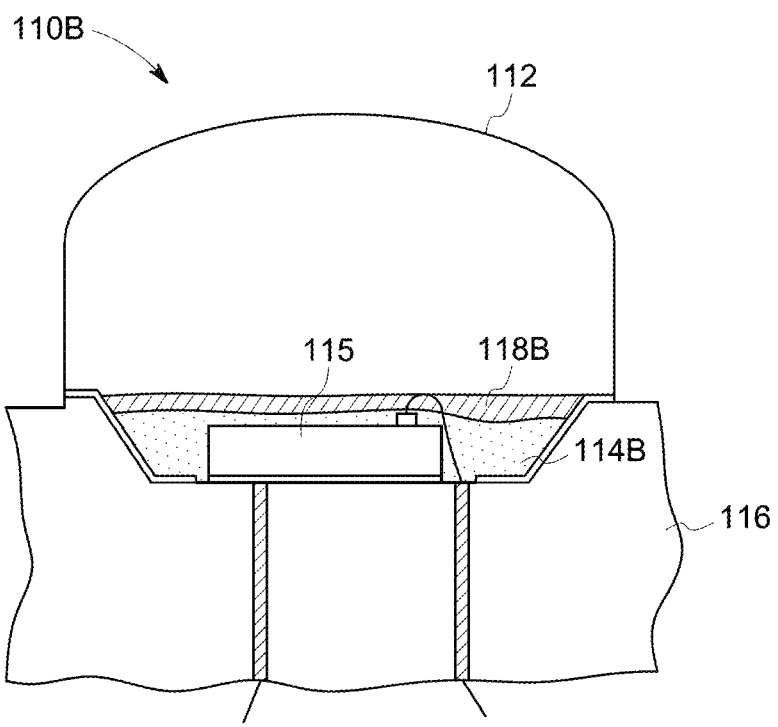

In an alternative exemplary embodiment shown in FIG. 11B, the phosphor layer 114b may be a conventionally fabricated encapsulant layer, and a separate encapsulant layer 118b with the Nd—F (e.g., Nd—X—F and/or $NdF_xO_y$) compound may be deposited on top of the phosphor layer 114b, e.g., using the appropriate conventional deposition/particle dispersion technique in a polymer or polymer precursor.

Figure 11C:
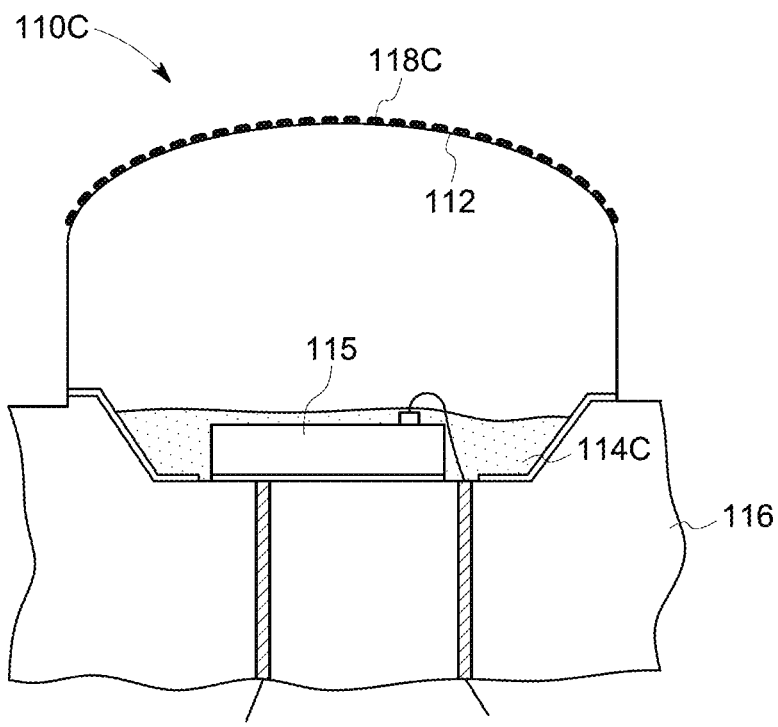

In a further exemplary embodiment shown in FIG. 11C, a Nd—F, Nd—X—F and/or $NdF_xO_y$ composite layer 118c can be coated on an outer surface of the dome (shell) 112. The performance of the coated layer 118b is similar to the performance of the encapsulant layer 118b with the Nd—F (e.g., Nd—X—F and/or NdF$_x$O$_y$) compound in FIG. 11B. Alternatively, the coating 118c in FIG. 11C can be deposited on an inner surface of the dome 112. More implementation details regarding coating of the dome/substrate will be discussed in reference to FIGS. 12-15. It is noted that the dome 112 itself can be transparent or translucent.

Figure 11D:
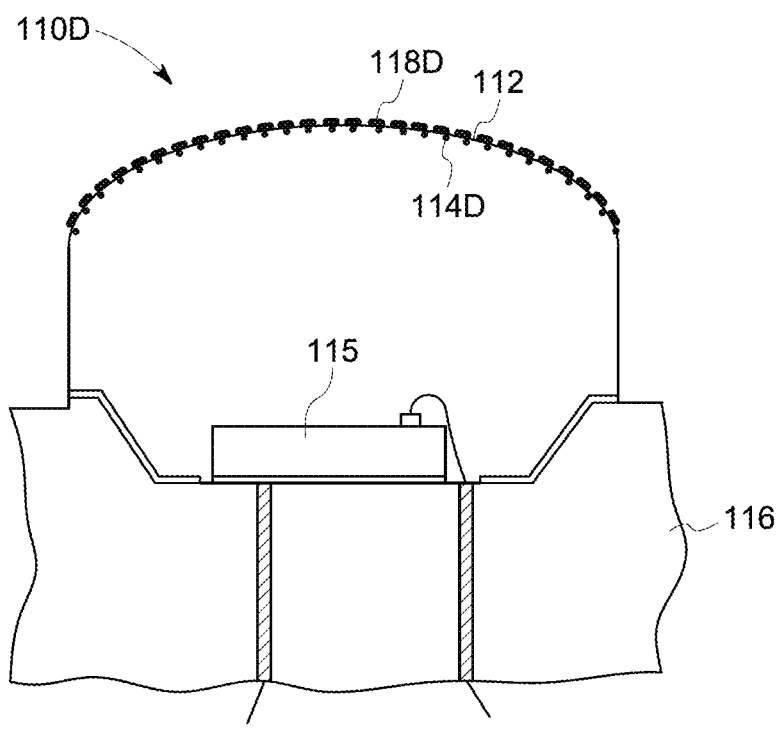

In yet a further exemplary embodiment, as shown in FIG. 11D, the dome (shell) 112 can be used to deposit both Nd—F, Nd—X—F and/or NdF$_x$O$_y$ composite layer/coating 118d on the outer surface of the dome 112 and a phosphor coating layer 64d on the inner surface of the dome 112. It is further noted that there may be different variations of this approach. For example, both coatings 114d and 118d may be deposited on one surface (outer or inner surface) of the dome 112 with the phosphor coating 114d being closer than the coating 118d to the LED chip 115. Also, coatings 114d and 118d (when deposited on one surface of the dome 112) can be combined in one layer similar to the encapsulant compound layer 114a in FIG. 11a. It is noted that the dome 112 itself can be transparent, translucent or transflective, in order to implement different variations of the example shown in FIG. 11D.

Below are several non-limiting examples of an LED-based lighting apparatus using the coating containing the Nd—F, Nd—X—F and/or NdF$_x$O$_y$ compound causing a desired color filter effect.

Figure 12:
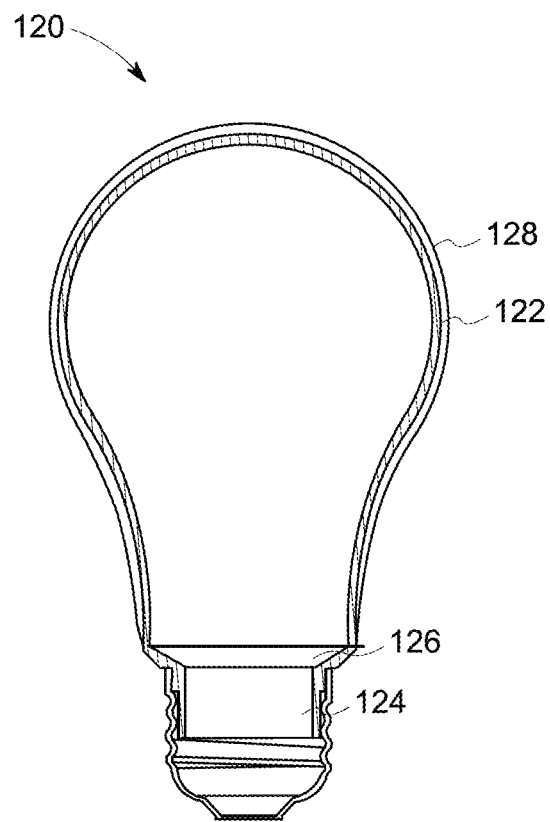
FIG. 12 is a cross-sectional view of an LED-based lighting apparatus in accordance with one embodiment of the invention.

FIG. 12 is an LED-based lighting apparatus suitable for area lighting applications in accordance with one embodiment of the invention. The LED-based lighting apparatus (which may also be referred to as a "lighting unit" or "lamp") is an LED lamp 120 configured to provide a nearly omnidirectional lighting capability. As shown in FIG. 12, the LED lamp 120 includes a bulb 122, a connector 124, and a base 126 between the bulb 122 and the connector 124, and a coating 128 on an outer surface of the bulb 122. The coating 128 includes the Nd—F, Nd—X—F and/or NdF$_x$O$_y$ compound described herein. In other embodiments, the bulb 122 can be replaced by other transparent or translucent substrates. Alternatively, the coating 128 may be coated on an inner surface of the bulb 122 which can be transparent or translucent.

Figure 13:
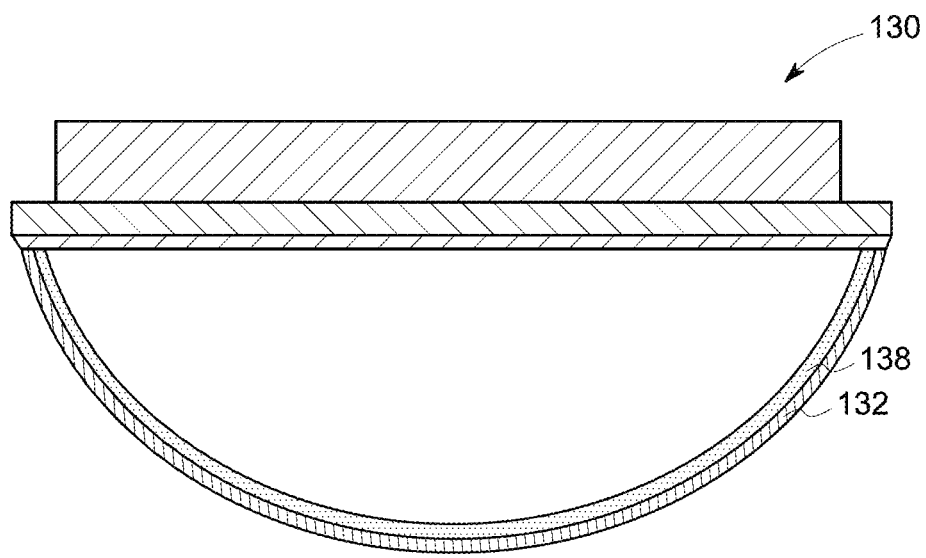
FIG. 13 is a cross-sectional view of an LED-based lighting apparatus in accordance with another embodiment of the invention.

FIG. 13 is an LED-based lighting apparatus 130 in accordance with a further embodiment of this invention. As shown in FIG. 13, the LED-based lighting apparatus is a ceiling lamp 130 (LED chip is not shown). The ceiling lamp 130 includes a hemispherical substrate 132 and a coating 138 containing the Nd—F, Nd—X—F and/or NdF$_x$O$_y$ compound; the coating 138 is on an inner surface of the hemispherical substrate 132. Alternatively, the coating 138 may be coated on an outer surface of the hemispherical substrate 132 which can be transparent or translucent.

Figure 14:
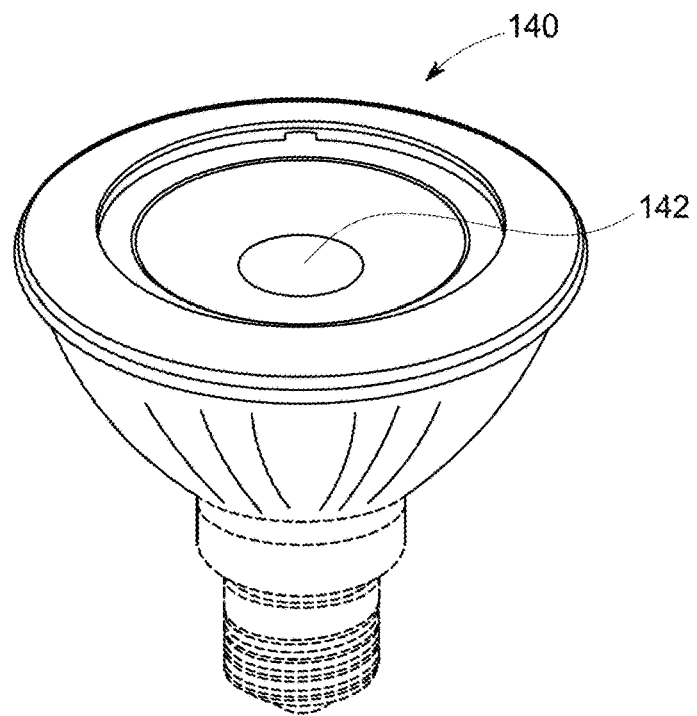
FIG. 14 is a perspective view of a LED-based lighting apparatus in accordance with a further embodiment of this invention.

FIG. 14 is an LED-based lighting apparatus in accordance with a further embodiment of this invention. As shown in FIG. 14, the LED-based lighting apparatus is a lens 140, and the lens 140 includes a flat substrate 142. In this embodiment, the flat substrate 142 includes the Nd—F, Nd—X—F and/or NdF$_x$O$_y$ compound coating (not shown) on an outer surface thereof.

Figure 15:
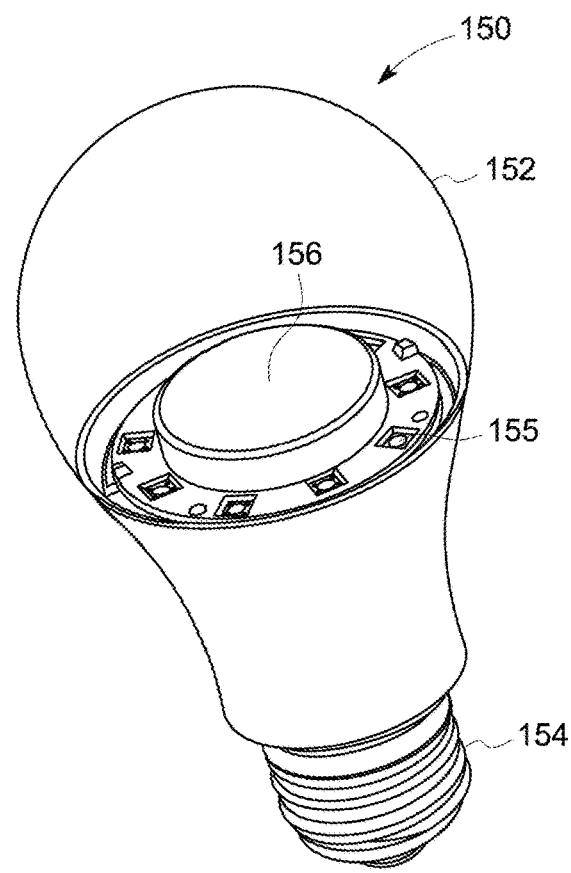
FIG. 15 is a perspective view of a LED-based lighting apparatus in accordance with one further embodiment of this invention.

FIG. 15 is an LED-based lighting apparatus 150 in accordance with one further embodiment of the invention. The LED-based lighting apparatus 150 includes a bulb (dome) 152, at least one LED chip 155 and a reflective substrate 156. The reflective substrate 156 is configured to reflect the visible light generated by the LED chip 155. In an embodiment described herein, the reflective substrate 156 includes Nd—F, Nd—X—F and/or NdF$_x$O$_y$ compound coating (not shown) on an outer surface thereof for providing the desired filtering. In FIG. 15 the dome (152) can be constructed of a diffusing material, so that a certain amount of light from the LEDs will pass through, and a certain amount will be reflected back into the cavity (these amounts depend on how highly diffusing the dome material is). The reflected light will either reflect specularly or diffusely, depending on the diffusivity of the dome 152. These diffuse and/or specular reflections from the dome 152 will be incident upon the reflective substrate 156 coated according to one of the embodiment described herein. Alternatively the dome 152 can be constructed from a semi-reflective broadband material to provide the same functionality.

The coating materials described herein, including a compound containing Nd3+ ions and F− ions, may have little optical scattering (diffusion) effect; or, alternatively, may cause considerable optical scattering on light passing therethrough. To increase a scattering angle, the coating may include discrete particles of an organic or inorganic material. Alternatively, the organic or inorganic material can be solely made up of discrete particles of the Nd—F, Nd—X—F and/or NdF$_x$O$_y$ compound (e.g., formed partially or entirely of the Nd—F, Nd—X—F and/or NdF$_x$O$_y$ compound) and/or made up of a mixture of discrete particles of the N Nd—F, Nd—X—F and/or NdF$_x$O$_y$ compound (e.g., formed partially or entirely of the Nd—F, Nd—X—F and/or NdF$_x$O$_y$ compound) and particles formed of at least one other different material.

In one embodiment, a suitable particle size for the organic or inorganic material can be from about 1 nm to about 10 microns. For the LED lamp 120 shown in FIG. 12, in order to maximize a scattering angle so that the LED lamp 120 could achieve omni-directional lighting, the particle size may be chosen to be much less than 300 nm to maximize efficiency of a Rayleigh scattering.

Although not intended to be limiting, the Nd—F, Nd—X—F and/or NdF$_x$O$_y$ compound coating may be applied by, for example, spray coating, roller coating, meniscus or dip coating, stamping, screening, dispensing, rolling, brushing, bonding, electrostatic coating or any other method that can provide a coating of even thickness. The following will describe three non-limiting examples of how to provide the Nd—F and/or Nd—X—F compound coating on the substrate.

In one embodiment, as shown in FIG. 12, the coating 178 may be coated on the bulb 122 by a bonding method. The LED lamp 120 can include a bonding layer (not shown) between the bulb 122 and the coating 128, and the bonding layer may include an organic adhesive or an inorganic adhesive. The organic adhesive can include an epoxy resin, an organic silicone adhesive, an acrylic resin, etc. The inorganic adhesive can include a silicate inorganic adhesive, a sulfate adhesive, a phosphate adhesive, an oxide adhesive, a boric acid salt adhesive etc.

In another embodiment, as shown in FIG. 12, the coating 128 may be coated on the outer surface of the bulb 122 by a spray-coating method. Firstly, a liquid mixture containing, for example, the Nd—F, Nd—X—F and/or NdF$_x$O$_y$ compounds, silicone dioxide, dispersant such as DISPEX A40, water and optionally TiO$_2$ or Al$_2$O$_3$ is formed. Subsequently, the formed liquid mixture is sprayed onto the bulb 122. Finally, the bulb 122 is cured to obtain the coated LED lamp 120.

In one embodiment, as shown in FIG. 12, the coating 128 may be coated onto the outer surface of the bulb 122 by an electrostatic coating method. Firstly, electrically charged powder consisting, for example, the Nd—F, Nd—X—F and/or $NdF_xO_y$ compounds, $SiO_2$ and $Al_2O_3$ is produced. Subsequently, the powder is coated onto the bulb 122 which is oppositely charged.

In other embodiments of the invention, both the spray coating method and the electrostatic coating method may use materials without organic solvent or organic compound, which can extend the service life of the LED light apparatus and avoid the discoloration typically caused by sulfonation.

In a further embodiment, a weight percentage of $NdF_3$ or another $Nd^{3+}$ ion source (for examples, using Nd—F, Nd—X—F and/or $NdF_xO_y$ compound) in the coating may be between 1% to about 20%. In one specific embodiment, the weight percentage of $NdF_3$ or another $Nd^{3+}$ ion source in the coating may be in a range from about 1% to about 10%. In other embodiments, to promote refraction of the light to achieve a white reflective appearance, the coating further may include an additive having a higher refractive index relative to the Nd—F, Nd—X—F and/or $NdF_xO_y$ compound. The additive can be selected from metal oxides and non-metal oxides, such as $TiO_2$, $SiO_2$ and $Al_2O_3$.

Unless defined otherwise, technical and scientific terms used herein have the same meaning as is commonly understood by one having ordinary skill in the art to which this disclosure belongs. The terms "first", "second", and the like, as used herein, do not denote any order, quantity, or importance, but rather are employed to distinguish one element from another. Also, the terms "a" and "an" do not denote a limitation of quantity, but rather denote the presence of at least one of the referenced items. The use of "including," "comprising" or "having" and variations thereof herein are meant to encompass the items listed thereafter and equivalents thereof, as well as additional items. The terms "connected" and "coupled" are not restricted to physical or mechanical connections or couplings, and can include electrical and optical connections or couplings, whether direct or indirect.

Furthermore, the skilled artisan will recognize the interchangeability of various features from different embodiments. The various features described, as well as other known equivalents for each feature, can be mixed and matched by one of ordinary skill in this art, to construct additional systems and techniques in accordance with principles of this disclosure.

In describing alternate embodiments of the apparatus claimed, specific terminology is employed for the sake of clarity. The invention, however, is not intended to be limited to the specific terminology so selected. Thus, it is to be understood that each specific element includes all technical equivalents that operate in a similar manner to accomplish similar functions.

It is to be understood that the foregoing description is intended to illustrate and not to limit the scope of the invention, which is defined by the scope of the appended claims. Other embodiments are within the scope of the following claims.

It is noted that various non-limiting embodiments described and claimed herein may be used separately, combined or selectively combined for specific applications.

Further, some of the various features of the above non-limiting embodiments may be used to advantage, without the corresponding use of other described features. The foregoing description should therefore be considered as merely illustrative of the principles, teachings and exemplary embodiments of this invention, and not in limitation thereof.

What is claimed is:

1. An apparatus comprising:
    at least one light emitting diode (LED) module, configured to generate a visible light, the LED module being encapsulated within an optical component;
    a first layer comprising a $NdF_xO_y$ compound, the $NdF_xO_y$ compound (i) being deposited on a surface of the optical component; and (ii) having corresponding concentrations of neodymium (Nd), fluorine (F) and oxygen (O), where values of x and y determine a ratio of the F and O and are adjusted during manufacturing of the $NdF_xO_y$ compound to provide desired output light parameters of the apparatus including at least a desired output light spectrum realized by filtering the generated visible light using the $NdF_xO_y$ compound; and
    a polymer composite layer (i) being deposited on a surface of the at least one LED module and (ii) comprising the $NdF_xO_y$ compound blended with a phosphor;
    wherein the value of x is between 0.3 and 0.5, and the value of y is between 1.25 and 1.33.

2. The apparatus of claim 1, wherein the LED module is mounted on a printed circuit board.

3. The apparatus of claim 1, wherein the first layer and the polymer composite layer are combined to form one layer on the surface of the optical component.

4. The apparatus of claim 1, wherein one of the first layer and the polymer composite layer is deposited on an outer surface of the optical component, and the other of the first layer and the polymer composite layer is deposited on an inner surface of the optical component.

5. The apparatus of claim 1, wherein the $NdF_xOy$ compound comprises a desired absorption peak in a wavelength range between about 560 nm and 600 nm to provide the desired output light spectrum.

6. The apparatus of claim 5, wherein a desired refractive index at the desired absorption peak is from about 1.6 to about 1.8.

7. The apparatus of claim 1, wherein the $NdF_xO_y$ compound is a single crystalline phase compound.

8. The apparatus of claim 1, wherein the $NdF_xO_y$ compound is manufactured by wet chemical processing from neodymium oxide ($Nd_2O_3$) using fluoridation processing with a flowing gas of fluorine ($F_2$) or with hydrofluoric acid (HF).

9. The apparatus of claim 8, wherein x and y in the $NdF_xO_y$ are controlled during the fluoridation processing using varying one or more parameters including: hydrofluoric acid (HF) concentration, processing temperature, reaction time, and fluorine gas ($F_2$) concentration.

10. The apparatus of claim 1, wherein the $NdF_xO_y$ compound is manufactured by dry processing using a solid reaction method comprising blending neodymium oxide ($Nd_2O_3$) with neodymium fluoride ($NdF_3$) at a predefined weight ratio of the $Nd_2O_3$ and $NdF_3$, to form a blended compound, followed by high temperature synthesis of the $NdF_xO_y$ compound from the blended compound under a protective atmosphere of an inert gas, wherein the predefined weight ratio of the $Nd_2O_3$ and $NdF_3$ corresponds to the ratio of F and O in the manufactured $NdF_xO_y$ compound.

11. The apparatus of claim 10, wherein the inert gas comprises nitrogen ($N_2$) gas or argon (Ar) gas.

12. The apparatus of claim 11, wherein the predefined weight ratio of $Nd_2O_3$ and $NdF_3$ is about 80% to about 20%, and the manufactured $NdF_xO_y$ compound has a composition $NdF_{0.33}O_{1.33}$, with x being about 0.33 and y being about 1.33.

13. The apparatus of claim 10, wherein a temperature of the high temperature synthesis is greater than 800° C.

14. The apparatus of claim 1, wherein the at least one LED module comprises an organic LED.

15. The apparatus of claim 1, wherein a weight percentage of the NdF$_x$O$_y$ compound in the first layer is from about 1% to about 20%.

16. The apparatus of claim 1, wherein a thickness of the first layer is in a range from about 50 nm to about 1000 microns.

17. The apparatus of claim 1, wherein the optical component is a diffuser being selected from the group consisting of a bulb, a lens, and a dome.

* * * * *